(12) United States Patent
Ludwig et al.

(10) Patent No.: US 7,990,158 B2
(45) Date of Patent: Aug. 2, 2011

(54) MEASUREMENT ARRANGEMENT FOR DETERMINING THE CHARACTERISTIC LINE PARAMETERS BY MEASURING SCATTERING PARAMETERS

(75) Inventors: Thomas Ludwig, Sindelfingen (DE); Helmut Schettler, Dettenhausen (DE); Thomas-Michael Winkel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 465 days.

(21) Appl. No.: 12/050,997

(22) Filed: Mar. 19, 2008

(65) Prior Publication Data

US 2008/0211517 A1 Sep. 4, 2008

(30) Foreign Application Priority Data

Mar. 23, 2007 (EP) .................................. 07104752

(51) Int. Cl.
 *G01R 27/04* (2006.01)
 *G01R 27/32* (2006.01)
(52) U.S. Cl. ........................ 324/638; 324/637
(58) Field of Classification Search .................. 324/638, 324/637
See application file for complete search history.

(56) References Cited

U.S. PATENT DOCUMENTS

| | | | | |
|---|---|---|---|---|
| 6,480,989 | B2* | 11/2002 | Chan et al. | 716/8 |
| 6,586,828 | B2* | 7/2003 | Buffet et al. | 257/691 |
| 7,088,110 | B1* | 8/2006 | Bois et al. | 324/638 |
| 7,340,703 | B2* | 3/2008 | Hegazy et al. | 716/5 |
| 2004/0237013 | A1* | 11/2004 | Larson et al. | 714/724 |
| 2006/0022678 | A1* | 2/2006 | Hegazy et al. | 324/525 |

OTHER PUBLICATIONS

Thomas-Michael Winkel et al. "An Accurate Determination of the Characteristic Impedance of Lossy Lines on Chips Based on High Frequency S-Parameter Measurements", IEEE Multi-Chip Module Conference MCMC'96, pp. 190-195, Feb. 1996.
Thomas-Michael Winkel "Untersuchung der Kipplung zwischen Leitungen auf Silizium-Substraten unterschiedlicher Leitfahigkeit unter verwendung breibandiger Messungen", Ph.D Thesis, University of Hannover, Nov. 1997, pp. 50-77.
Zinke/Brunswig "Lehrbuch der Hochfrequenztechnik", Springer-Verlag, 1989, pp. 170-189.

* cited by examiner

*Primary Examiner* — Jeff Natalini
(74) *Attorney, Agent, or Firm* — John E. Campbell

(57) ABSTRACT

The present invention relates to a measurement arrangement for determining the characteristic line parameters by measuring the S-parameters as a function of the frequency of transmission lines. A voltage mesh and a ground mesh in a metal layer are connected symmetrically to a reference ground (RG) in the layer at all ends.

16 Claims, 5 Drawing Sheets

MEASUREMENT ARRANGEMENT FOR DETERMINING THE CHARACTERISTIC LINE PARAMETERS BY MEASURING SCATTERING PARAMETERS

FIELD OF THE INVENTION

The present invention relates to a measurement arrangement for determining the characteristic line parameters by measuring scattering parameters (S-parameters) as a function of the frequency of an electrical signal line according to the features of claim 1.

BACKGROUND

Model to hardware correlation measurements on all packaging levels are essential in today's development process of high performance computers. Different measurement techniques in time and frequency domain require different measurement set-ups and test site designs. One demand for the test site is to be equivalent to the product. Therefore, transmission lines on a chip need to be measured in the product like power and ground wiring distributed in all metal layers on chip. In addition it is not only of interest to measure a single transmission line but also with a product like wiring channel utilization. This is essential to real signal coupling behaviour on the chip and the effect of metal layers between top metal layers and the semi conducting substrate.

A known measurement technique is the so-called S-parameter measurements, see Zinke/Brunswig, "Lehrbuch der Hochfrequenztechnik", Springer-Verlag, 1989, pp. 170-189. S-parameters are reflection and transmission coefficients of an n-port network. The equivalent for a single transmission line e.g. is a two port network characterized by a 2×2 S-parameter matrix.

A two-port network is described by the relationship $$\begin{pmatrix} b_1 \\ b_2 \end{pmatrix} = \begin{pmatrix} S_{11} & S_{12} \\ S_{21} & S_{22} \end{pmatrix} \cdot \begin{pmatrix} a_1 \\ a_2 \end{pmatrix}$$

wherein S11, S22, S12 and S21 are the S-parameters, namely
S11=Input reflection coefficient with the output port terminated by a matched load,
S22=Output reflection coefficient with the input terminated by a matched load,
S12=Reverse transmission (insertion) gain with the input port terminated in a matched load,
S21=Forward transmission (insertion) gain with the output port terminated in a matched load, and the variables a1, a2 and b1, b2 are complex voltage waves incident on and reflected from the first and second port of the two-port network.

In the present case the S-parameter measurements is an advantageously measurement technique because the S-parameter are easier to measure and work with at high frequencies than other kinds of parameters.

Furthermore, different methods are well-known in the state of the art to extract other characteristic frequency dependent line parameters, such as characteristic impedance Z(f) or propagation constant γ(f) etc., from the S-parameter measurements, so that these parameters can be easily obtained from the S-parameter measurements, Thomas-Michael Winkel, Lohit Sagar Dutta, Hartmut Grabinski, "An Accurate Determination of the Characteristic Impedance of Lossy Lines on Chips Based on High Frequency S-Parameter Measurements", IEEE Multi-Chip Module Conference MCMC'96, pp. 190-195, February 1996, Thomas-Michael Winkel, "Untersuchung der Kopplung zwischen Leitungen auf Silizium-Substraten unterschiedlicher Leitfähigkeit unter Verwendung breibandiger Messungen", Ph D. Thesis, University of Hannover, November 1997, pp. 50-77.

A requirement for the high frequency S-parameter measurements in this case is that the transmission lines are not connected to any active device on chip.

A special requirement for the high frequency S-parameter measurements is that the signal line structure, including the voltage and ground lines, has to be designed in a way to ensure that only one signal mode can be propagated along the signal line structure. Different signal modes can propagate along a transmission line in presence of one or more adjacent signal lines or if the transmission line is referenced to more then just one reference plane or line.

As evidenced from the forgoing discussion, it is desirable to provide a measurement system for determining the S-parameters as a function of the frequency of an electrical signal line which does not suffer from the above-noted drawbacks and leads to a significant gain of the measurement bandwidth.

SUMMARY OF THE INVENTION

The present invention relates to a measurement arrangement for determining the characteristic transmission line parameters by measuring the S-parameters as a function of the frequency of an electrical signal line that achieves an increased measurement bandwidth, namely a measurement bandwidth >4 GHz.

The inventive measurement arrangement comprises a reference ground connection, wherein the voltage mesh and the ground mesh in the metal layer are connected symmetrically to the reference ground in the layer at all ends.

As a result of the special connection pattern both ports look at least nearly identical. Therefore, only one signal mode is excited and the frequency bandwidth is increased significantly. The structure is preferably a 3D-structure with a number of layers. Preferably, the voltage and ground mesh are separated during measurement in all metal layers and connected just on the very beginning and the very end of a transmission line under test to the reference ground.

Model to hardware correlation measurements on all packaging levels can be performed with the invention in today's development process of high performance computers. Different measurement techniques in time and frequency domain require according to prior art solutions different measurement set-ups and test site designs. Since the demand for the test site is equivalent to the product, the invention enables due to the symmetric design a practical use of a test device. Furthermore, transmission lines, performed as voltage and ground wiring mesh, on chip could be measured in a product.

According to a preferred embodiment of the invention the arrangement is performed for measuring a structure for a multi-layer chip.

In such an arrangement, the on chip voltage and ground mesh is normally not connected. If this structure is used in a test device (vehicle), only two signal modes are able to propagate along the transmission line resulting in a reduction of the measurement bandwidth. But, if the on chip transmission lines performed as voltage and ground mesh, embedded in a product have to be characterized by high frequency measurements, both demands (one signal reference, product like voltage ground mesh) can be satisfied in a test device design according to the preferred embodiment.

In order to ensure a high bandwidth of the measurements both input ports of the measurements look identical. This can be proven by comparing the measured reflection parameters from both measurement ports, port 1 (S11) and port 2 (S22), which need to be nearly identical. As a result only one signal mode is excited and the frequency bandwidth is higher then 20 GHz.

The number of neighbouring signal lines having low impedance on their first ends or their second ends is preferably equal or nearly equal to the number of neighbouring further (second) signal lines having high impedance on their first or second ends. As a result of the special connection pattern both ports look at least nearly identical. Therefore, only one signal mode is excited and the frequency bandwidth is increased significantly.

The low impedance could be formed by a closed-end line (connection to ground) and the high impedance could be formed by an open-ended line. Preferably, the measuring line is in a plane arrangement and the neighbouring signal lines are arranged in-plane to the measuring line in a line pattern matter or in a parallel arrangement. Preferably, neighbouring signal lines arranged directly adjacent to each other have a different impedance on their first ends and their second ends, so that the first ends and second ends of all neighbouring signal lines are alternating terminated by a low impedance and a high impedance, respectively. This leads to an alternating arrangement on port 1 and port 2, respectively. This means both ports have an identical appearance and as a result the frequency bandwidth is increased to more than 20 GHz.

According to another feature of the invention, the number of neighbouring signal lines on both sides of the measuring line is equal.

In accordance with still another feature of the invention, the measuring line and the neighbouring signal lines are signal lines in a multi-layer chip, wherein the direction of the signal lines between two adjacent layers is rotated by 90°, and the measuring line and its neighbouring signal lines are arranged in the same layer (measuring layer) in a parallel arrangement, and the signal lines in the layers adjacent to the measuring layer (neighbouring layer lines) are also arranged in a parallel arrangement and having a different impedance on their first ends and their second ends, respectively, so that the first ends and second ends of all neighbouring layer lines are terminated by a low impedance and a high impedance, respectively, and the number of neighbouring layer lines having a low impedance on their first ends or their second ends is equal or nearly equal to the number of neighbouring layer lines having a high impedance on their first ends or their second ends. Preferably, neighbouring layer lines arranged directly adjacent to each other have a different impedance on their first ends and their second ends, so that the first ends and second ends of all neighbouring layer lines are alternating terminated by a low impedance and a high impedance, respectively. This alternating arrangement of the neighbouring layer lines in connection with the alternating arrangement of neighbouring signal lines lead to a significant gain of measurement bandwidth. Experiments have shown that due to the inventive arrangement of on chip wiring the bandwidth is increased up to 20 GHz. The measuring line and the neighbouring lines are arranged as a bunch.

BRIEF DESCRIPTION OF THE DRAWINGS

Additional objects, advantages, and features of the present invention will become apparent from the following description taken in conjunction with the accompanying drawings, wherein.

DETAILED DESCRIPTION OF THE INVENTION

Figure 1:
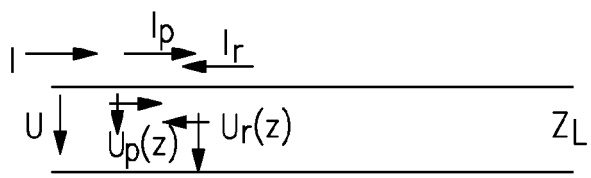
FIG. 1 depicts a schematic view of the measurement principle according to S-parameter theory.

FIG. 1 shows a schematic view of the measurement principle according to S-parameter theory. Using high frequency the measurement of voltage and current is difficult. The signal lines are in this case wave guides. The voltage U1 and the current I1 is given by the formula according to FIG. 1. ai and bi is the definition of forward and backward travelling normalized waves. Reflection and transmission factors can be measured by S-parameter measurement as shown in FIG. 1.

Figure 2:
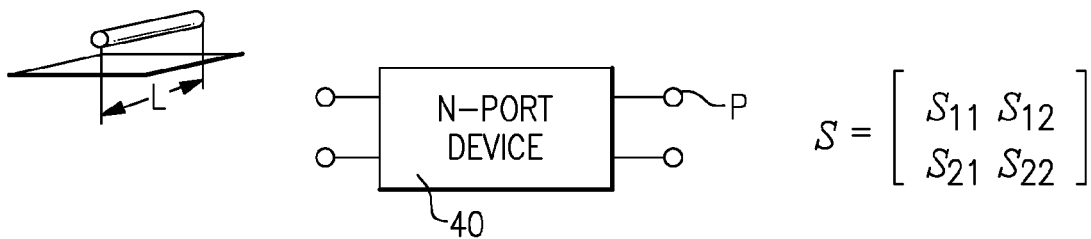
FIG. 2 depicts a schematic view of a S-parameter measurement with frequency dependant line parameters.

The invention use S-Parameter Measurement with a device 40 having a number of ports (N-Port device). The device comprises a number N of ports P. In FIG. 2 two ports P are shown. The formula T and A enables transformation of parameters. The parameters are dependent from the frequency.

A characteristic parameter is a characteristic impedance $Z(f)$, a propagation constant $\gamma(f)$, a attenuation constant $\alpha(f)$, a phase constant $\beta(f)$, a phase velocity $v(f)$, model parameter(s) $R(f), L(f), C(f), G(f)$ and/or material parameter(s) $\epsilon$eff, tan $\delta$.

All transformations could be performed in the frequency domain used in a high performance computer.

Figure 3:
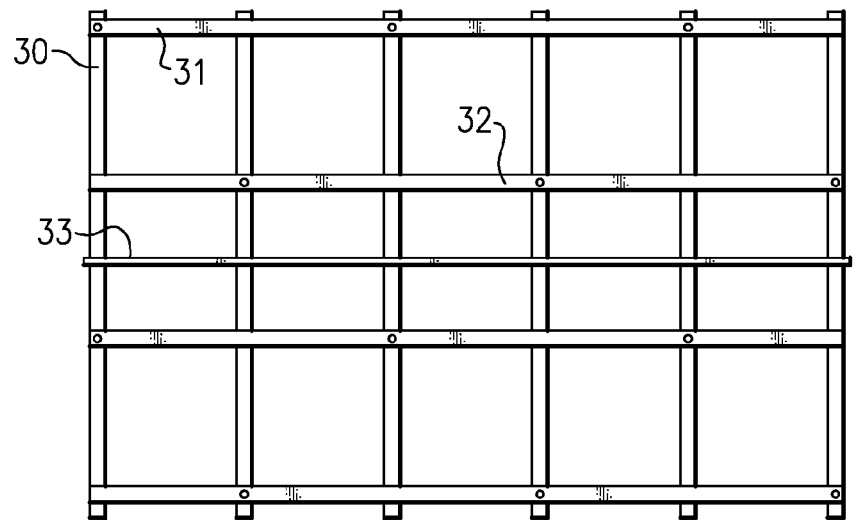
FIG. 3 depicts a schematic view of a 2D-view of a metal multi-layer chip with a ground mesh, a voltage mesh and embedded signal lines.

FIG. 3 illustrates a metal multi-layer chip with a first ground mesh 30 in first layer, a second ground mesh 31 in a second layer, a voltage mesh 32 in the second layer and an embedded signal line 33. The first and the second ground mesh 30, 31 are 90° drifted. The voltage mesh 32 is parallel to the second ground mesh 31 and 90° drifted to the first ground mesh 30.

The signal line 33 is arranged parallel to the second mesh 31 and 90° drifted to the first ground mesh 30.

The invention relates to the ground mesh and the voltage mesh.

Figure 4:
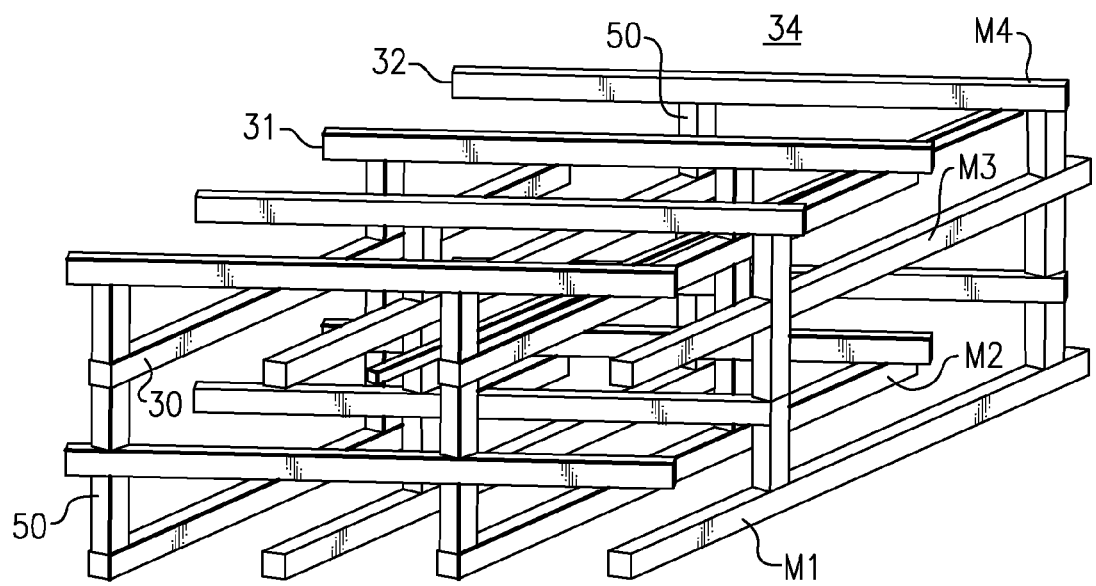
FIG. 4 depicts a 3D-view of a multi-layer chip.

The measurement arrangement for determining the characteristic line parameters by measuring scattering parameters (S-parameters) as a function of the frequency of transmission lines according to the invention comprise a metal layer structure as shown in FIG. 3 or FIG. 4.

FIG. 4 is the perspective view of a multi-layer structure 34 comprising the voltage mesh and the ground mesh according to FIG. 3. Both meshes have a first and a second end. The structure comprises four metal layers M1-M4. Another number of layers is possible, like 2, 3, 5-10 layers.

Figure 5:
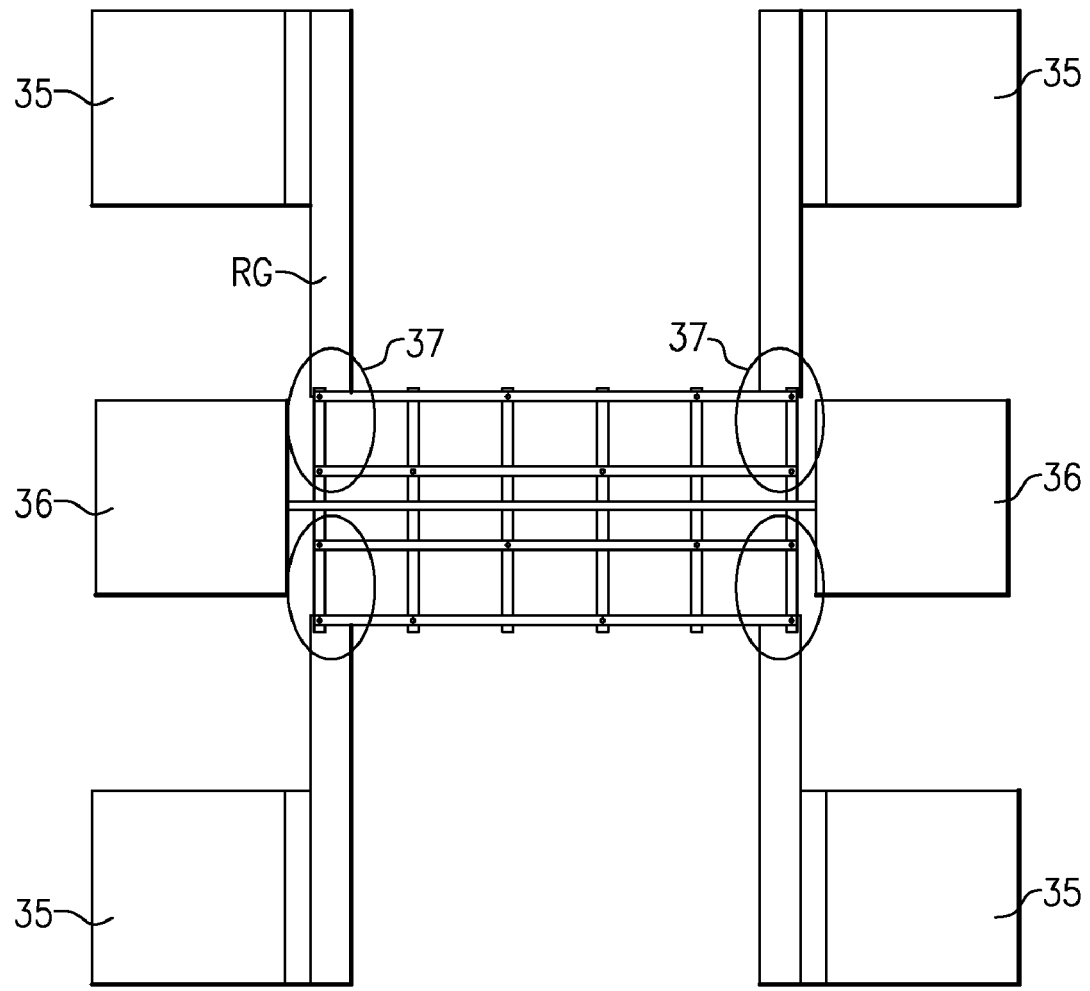
FIG. 5 depicts a schematic view of a connection of voltage and ground lines to reference ground.

As shown in FIG. 5, the voltage mesh and the ground mesh of FIG. 4 in the metal layer are connected symmetrically to a reference ground RG in the layer at all ends.

The reference ground RG is connected via four ground pads 35 located near to the edges of the structure 34. The schematic view of the inventive connection 37 of voltage and ground lines 30-32 to reference ground RG shows further, that two signal pads 36 are electrically connected to the signal line 33. In an alternative embodiment only two ground pads 36 are electrically connected to the structure 34 on each side.

The ground pads 35 (reference ground) are arranged symmetrical with respect to X-axis (direction of signal line 33) and symmetrical to a correspondent Y-axis (90° drifted).

For measurement, microwave probes are arranged on the top layer with the pads. The design of the pad is symmetrical with respect to the structure.

Figure 6:
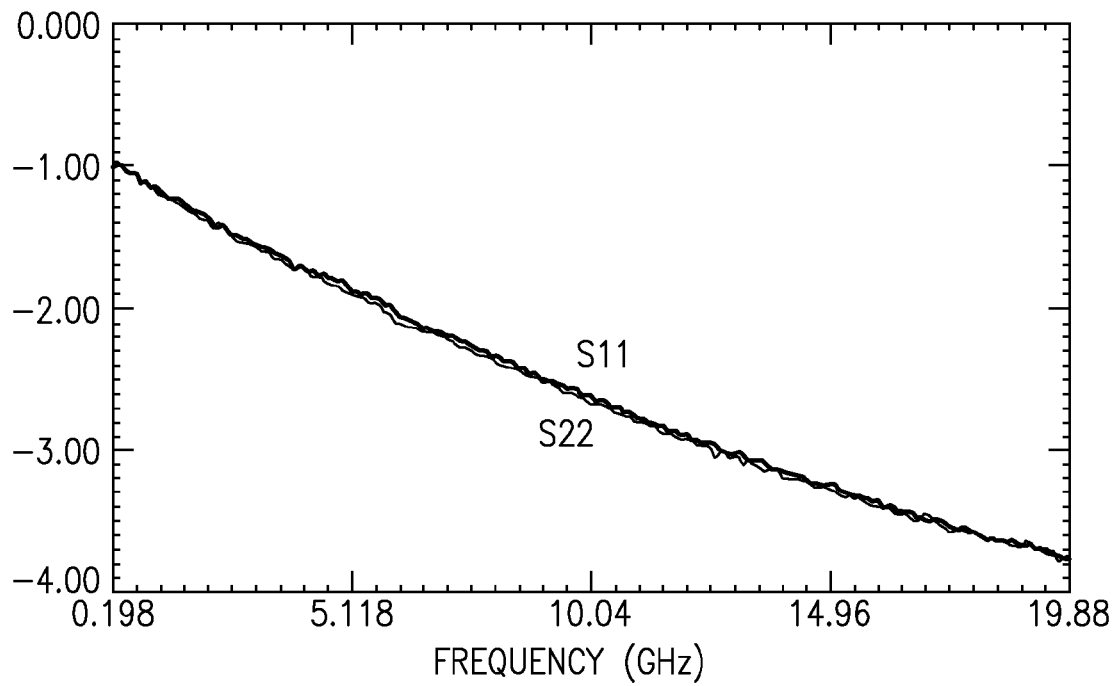
FIG. 6 depicts a magnitude of measured reflection parameters S11 and S22.

A comparison of magnitude of measured reflection parameters S11 and S22 for a port symmetrical test side with a connection of voltage ground lines to reference ground and signal ground pads according to the invention is shown in FIG. 6. As desired S11 and S22 are just equal.

Figure 7:
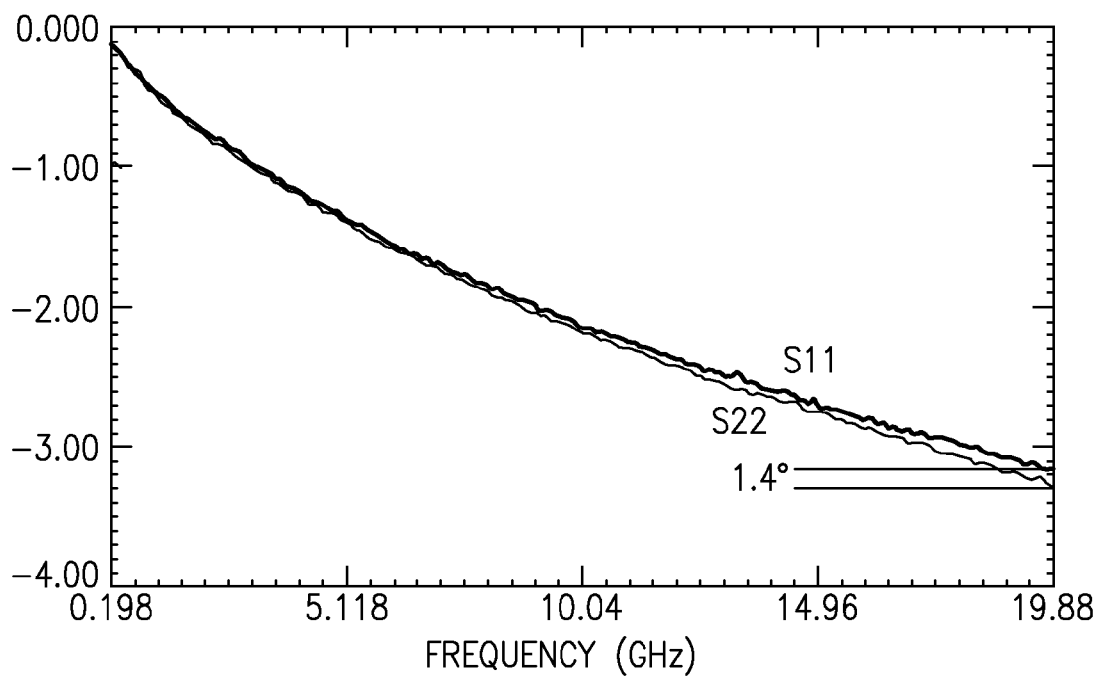
FIG. 7 depicts a phase of measured reflection parameters S11 and S22.

The comparison according to FIG. 7 of phase of measured reflection parameters S11 and S22 for the port symmetrical test side demonstrates a high frequency rage up to 20 GHz.

Using a multilayer-chip a frequency domain for 20 GHz ore more can be used.

Figure 8:
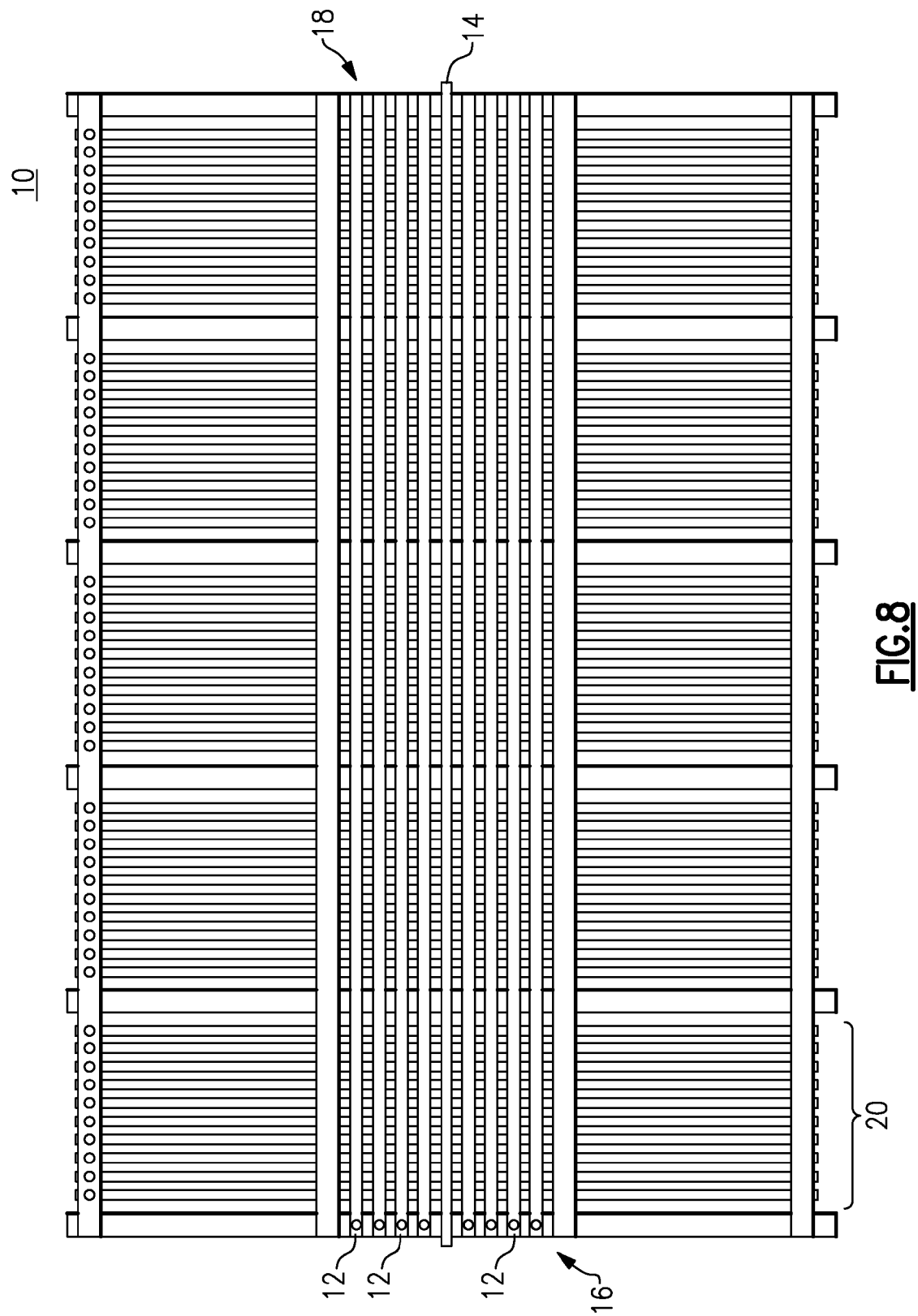
FIG. 8 depicts a schematic view of a multi-layer chip.

As shown in FIG. 8, a multi-layer chip 10 with more signal lines can be used.

In order to image the real signal coupling behaviour on the chip 10 additional signal lines 12, so-called neighbouring signal lines, were added adjacent to a signal line, the so-called measuring line, in the same layer.

In this second embodiment of the invention, the neighbouring signal lines 12 were connected by vias 50 to ground on one side 16, here port 1, to imitate a driver and left open on the opposite side 18, here port 2, to imitate a receiver.

In order to image the shielding effect of metal layers between top metal layers and the semi conducting substrate additional signal lines 20, the so-called neighbouring layer lines, were added in the bottom metal layers. All neighbouring signal lines 20 were also connected to ground on one side and left open on the opposite side.

Due to random and systematically measurement errors the measurement uncertainty for the magnitude is usually –3%. For frequencies >4 GHz the difference between both reflection parameters exceeds this value for the magnitude as well as for the phase. This means more than just one signal line mode is excited in this test structures. Therefore, all extracted transmission line parameters are just valid up to 4 GHz.

In order to increase the frequency bandwidth of the extracted data, the test site design needs to be modified according to the second embodiment of the invention. To ensure that the measured reflection parameters for port 1 (S11) 16 and port 2 (S22) 18 are nearly equal. This goal can be achieved by making both ports 16, 18 symmetrical from an electrical point of view.

The port symmetry was achieved by connection each second of the adjacent neighbouring signal lines 12 to ground on port 1 (S11) 16 while all the other adjacent neighbouring signal lines 12 are left open on port 1 (S11) 16. On port 2 (S22) 18 the adjacent neighbouring signal lines 12 which are left open on port 1 (S11) 16 are grounded on port 2 (S22) 18. All other neighbouring layer lines 20 in other metal layers are also connected to ground in the same alternating manner. As a result of this change, the measured reflection parameters for port 1 (S11) 16 and port 2 (S22) 18 are nearly identical for the magnitudes and for the phases in the frequency range at least up to 20 GHz. Some differences between both measured reflection parameters are usual but as a criterion for good measurement, the differences should not exceed the expected measurement uncertainty of 0.03 db (at 20 GHz) for the magnitude and 2° (at 20 GHz) for the phase.

Referring to the examples of FIG. 1-8, the frequency dependant propagation constant, characteristic impedance as well as the R, L, C and G parameters will be determined from the on chip parameters. A transmission line test structure is preferably embedded in a multi-layer test chip. A multi-layer structure is shown in FIG. 4. Relevant parameters are gained from the simulation.

The inventive arrangement takes in account increasing clock rates in computer chips and faster signal slope effects like dispersion, proximity effect, substrate losses and skin effect in adjacent voltage and ground lines. The invention could be apply to a five ore more copper metal layer test chip in a 0.18 μm SOI technology. The test chip comprises, for example, 90 mm SOI/Cu technology copper metal layers.

The symmetric design of the signal, power and ground-line distribution on the test chip is ideal for high frequency S-parameter measurement. In addition, line parameters can be extracted from FEM (finite element method) simulation.

The S-parameter measurement can be performed with a 2-port network analyzer in a frequency range from 200 Hz to 20 GHz. The network analyzer is preferably connected to flexible microwave cables to cascade microwave probes with characteristic impedance, like 50 Ω. A short-open-load-through (SOLT) calibration can be used to perform an off chip calibration of the network analyser in combination with the cables and the probes. In order to perform enhanced measurement in a product line the signal lines 12 (FIG. 8) were added in all metal layer (M1-M4, FIG. 4, for example). Since the test chip includes just passive line structures, these additional signal lines can be tied to ground on one side while the other end of the line is left open, for example. The effect is that the signal lines were not floating but were also not included in a ground return path. Alternatively both ends (ports) can be tied to ground.

According to this, a good accuracy of an observe frequency range can be reached. The test chip is to design in the test structure symmetrical regarding the reflection coefficient behaviour of both measurement ports (all ports 35 and 36, as shown in FIG. 5). This means the reflection coefficients of the measured two ports must be equal (S11=S22) in the complete frequency range, as shown in FIG. 6 or FIG. 7.

Furthermore, long lines running across the chip, so called global chip wiring connecting, respectively can be used.

The invention is not limited to the examples from FIG. 1 to FIG. 8. Each combination of features from drawings and/or the description is possible. As example a structure can be a combination of a structure according to FIG. 3 and FIG. 8.

LIST OF REFERENCES 10 multi-layer chip
12 neighbouring signal lines
14 measuring line
16 port 1
18 port 2
20 neighbouring layer lines
30 first ground mesh
31 second ground mesh
32 voltage mesh
33 embedded signal line
34 multi-layer structure
35 ground pad
36 signal pad
37 connection
40 device
50 via
M1-M4 metal layers
RG reference ground
S11, S22 reflection parameters

What is claimed is:

1. A method for determining characteristic line parameters of a device by measuring scattering parameters (S-parameters) as a function of frequency of transmission lines, the device comprising a voltage mesh, a ground mesh, a transmission line and one or more neighboring signal lines, the ground mesh disposed in metal layers parallel to metal layers of the voltage mesh, the transmission line and the one or more neighboring signal lines disposed between said voltage mesh and said ground mesh, wherein said one or more neighboring signal lines are parallel to said transmission line, the method comprising:

connecting a first voltage mesh end and a second voltage mesh end of said voltage mesh to a reference ground, a mesh comprising an electrically connected plurality of device wires in a device layer orthogonal and electrically connected to another plurality of device wires in a device layer;

symmetrically to said connection of said first voltage mesh end and said second voltage mesh end, connecting a first ground mesh end and a second ground mesh end of said ground mesh to said reference ground;

terminating only one end of the transmission line with a low impedance termination;

terminating each of said neighboring signal lines with a low impedance termination at a first end; and terminating each of said neighboring signal lines with high impedance at a second end; and measuring scattering parameters as a function of frequency of said transmission line disposed between said grounded meshes.

2. The method according to claim 1, wherein the first voltage mesh end, second voltage mesh end, first ground mesh end and second ground mesh end positionally correspond to respective ends of said transmission line under test.

3. The method according to claim 1, further comprising orienting microwave probes on pads in a top layer of the device.

4. The method according to claim 1, wherein the low impedance termination consists of a connection to reference ground and the high impedance termination consists of an open-end, the open-end not connected to reference ground.

5. The method according to claim 1, wherein said neighboring signal lines are parallel to said transmission line.

6. The method according to claim 5, wherein said first end of a first neighboring signal line is adjacent to a second end of an adjacent second neighboring signal line.

7. The method according to claim 1, further comprising orthogonal signal lines, wherein said orthogonal signal lines are orthogonal to said transmission line and disposed between said voltage mesh and said ground mesh.

8. The method according to claim 1, further comprising disposing one or more microwave probes at corresponding device pads, said device pads connected to said transmission line, wherein said measuring scattering parameters is accomplished by way of said one or more microwave probes.

9. A apparatus for determining characteristic line parameters of a device by measuring scattering parameters (S-parameters) as a function of frequency of transmission lines, the device comprising:

a voltage mesh;
a ground mesh;
a transmission line;
one or more neighboring signal lines; and
a scattering parameter measuring device, wherein the ground mesh is disposed in metal layers parallel to metal layers of the voltage mesh, the transmission line and the one or more neighboring signal lines disposed between said voltage mesh and said ground mesh, the transmission line disposed parallel to said one or more neighboring signal lines, the apparatus performing a method comprising:

connecting a first voltage mesh end and a second voltage mesh end of said voltage mesh to a reference ground, a mesh comprising an electrically connected plurality of device wires in a device layer orthogonal and electrically connected to another plurality of device wires in a device layer;

symmetrically to said connection of said first voltage mesh end and said second voltage mesh end, connecting a first ground mesh end and a second ground mesh end of said ground mesh to said reference ground;

terminating only one end of the transmission line with a low impedance termination;

terminating each of said neighboring signal lines with a low impedance termination at a first end; and terminating each of said neighboring signal lines with high impedance at a second end; and measuring scattering parameters as a function of frequency of said transmission line disposed between said grounded meshes.

10. The apparatus according to claim 9, wherein the first voltage mesh end, second voltage mesh end, first ground mesh end and second ground mesh end positionally correspond to respective ends of said transmission line under test.

11. The apparatus according to claim 9, further comprising orienting microwave probes on pads in a top layer of the device.

12. The apparatus according to claim 9, wherein the low impedance termination consists of a connection to reference ground and the high impedance termination consists of an open-end, the open-end not connected to reference ground.

13. The apparatus according to claim 9, wherein said neighboring signal lines are parallel to said transmission line.

14. The apparatus according to claim 13, wherein said first end of a first neighboring signal line is adjacent to a second end of an adjacent second neighboring signal line.

15. The apparatus according to claim 9, further comprising orthogonal signal lines, wherein said orthogonal signal lines are orthogonal to said transmission line and disposed between said voltage mesh and said ground mesh.

16. The apparatus according to claim 9, comprising microwave probes further comprising disposing one or more microwave probes at corresponding device pads, said device pads connected to said transmission line, wherein said measuring scattering parameters is accomplished by way of said one or more microwave probes.

* * * * *